(12) United States Patent
Truong et al.

(10) Patent No.: US 7,911,262 B2
(45) Date of Patent: Mar. 22, 2011

(54) EXTERNAL COMPENSATION FOR INPUT CURRENT SOURCE

(75) Inventors: Phat Truong, Houston, TX (US); Pauline Mai, Houston, TX (US); Chia-Jen Chang, Sugar Land, TX (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/413,596

(22) Filed: Mar. 29, 2009

(65) Prior Publication Data

US 2010/0244940 A1    Sep. 30, 2010

(51) Int. Cl.
G05F 1/10    (2006.01)
G05F 3/02    (2006.01)

(52) U.S. Cl. .................. 327/541; 327/112

(58) Field of Classification Search .......... 327/108, 327/112, 538, 540, 541, 543
See application file for complete search history.

(56) References Cited

U.S. PATENT DOCUMENTS

| | | | | |
|---|---|---|---|---|
| 5,581,197 A | * | 12/1996 | Motley et al. | 326/30 |
| 6,111,457 A | * | 8/2000 | Lim et al. | 327/541 |
| 6,614,295 B2 | * | 9/2003 | Tsuchi | 327/563 |
| 2003/0025541 A1 | * | 2/2003 | Humphrey et al. | 327/170 |
| 2004/0150464 A1 | * | 8/2004 | Khalid | 327/541 |

* cited by examiner

*Primary Examiner* — Quan Tra
(74) *Attorney, Agent, or Firm* — Winston Hsu; Scott Margo

(57) ABSTRACT

An integrated circuit includes: a pre-driver stage, coupled to an external supply voltage, for controlling the final driver stage; a final driver stage, coupled to the pre-driver stage and the external supply voltage, for providing an output voltage; a compensation circuit, coupled to the pre-driver stage, for providing a bias voltage to the pre-driver stage that compensates for variation in the external supply voltage, to control current through the pre-driver stage; and a bias circuit, coupled to the external supply voltage and the compensation circuit, for providing a bias voltage as an input to the compensation circuit.

8 Claims, 2 Drawing Sheets

US 7,911,262 B2

EXTERNAL COMPENSATION FOR INPUT CURRENT SOURCE

BACKGROUND OF THE INVENTION

1. Field of the Invention

The present invention relates to integrated circuits, and more particularly, to a method and apparatus for compensating external supply voltage in integrated circuits to ensure that output will compensate for any variation from external voltage supply.

2. Description of the Prior Art

Integrated circuits often suffer from PVT variations, which can affect the delicate workings of the internal circuits. Integrated circuits therefore require compensating circuits, which work to counteract the effect of these PVT variations.

A related art compensation method monitors a supply voltage, and utilizes variations in the supply voltage to activate a compensation circuit. When the supply voltage falls below a certain threshold, the compensation circuit is activated, and then deactivated once the supply voltage returns to above the threshold. The compensation circuit works to bring a falling delay in the circuit closer to a rising delay. This is because rising and falling delays are affected by PVT variations to different extents.

Another related art compensation method uses a compensation circuit that controls a bias voltage input to the circuit elements so that a constant threshold voltage is achieved. The bias of PMOS elements and NMOS elements are controlled separately.

If PVT variations in both the PMOS and NMOS elements could be controlled by a same circuit, supply voltage could be compensated for more accurately. Circuit complexity would also be reduced.

SUMMARY OF THE INVENTION

It is therefore an aim of the present invention to provide a method and apparatus for compensating external supply voltage to an integrated circuit that is simpler to implement than the above prior art methods.

A compensation circuit, for compensating an external supply voltage, the compensation circuit comprises: an operational amplifier, having a bias voltage as a first input of the operational amplifier, and a second input; a first PMOS pair, coupled to the output of the operational amplifier and the external supply voltage, where the output of the first PMOS pair is the second input of the operational amplifier; a second PMOS pair, coupled to the output of the operational amplifier and the external supply voltage, where the output of the second PMOS pair is an output voltage of the compensation circuit, and is equal to the input voltage $-\chi\Delta V$; a first NMOS circuit, coupled to the first and second PMOS pair by means of a blend connection, and coupled to the external supply voltage, a reference voltage, and a nominal voltage, for providing an output voltage equal to the reference voltage—the nominal voltage/3$-\chi\Delta V$; and a second NMOS circuit, coupled to the first NMOS circuit and the external supply voltage, for providing an output voltage equal to the external supply voltage/3.

An integrated circuit that implements the above-described compensation circuit comprises: a pre-driver stage, coupled to an external supply voltage, for controlling output slew rate; a final driver stage, coupled to the pre-driver stage and the external supply voltage, for providing an output voltage; a compensation circuit, coupled to the pre-driver stage, for providing a bias voltage to the pre-driver stage that compensates for variation in the external supply voltage, to control current through the pre-driver stage; and a bias circuit, coupled to the external supply voltage and the compensation circuit, for providing a bias voltage as an input to the compensation circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

The present invention utilizes the idea of bias voltages, for providing constant current/voltage to an integrated circuit, but implements a novel apparatus for supplying the same bias voltage to both PMOS and NMOS circuit elements. A novel method of compensating for PVT variation with this bias voltage is also provided.

Figure 1:
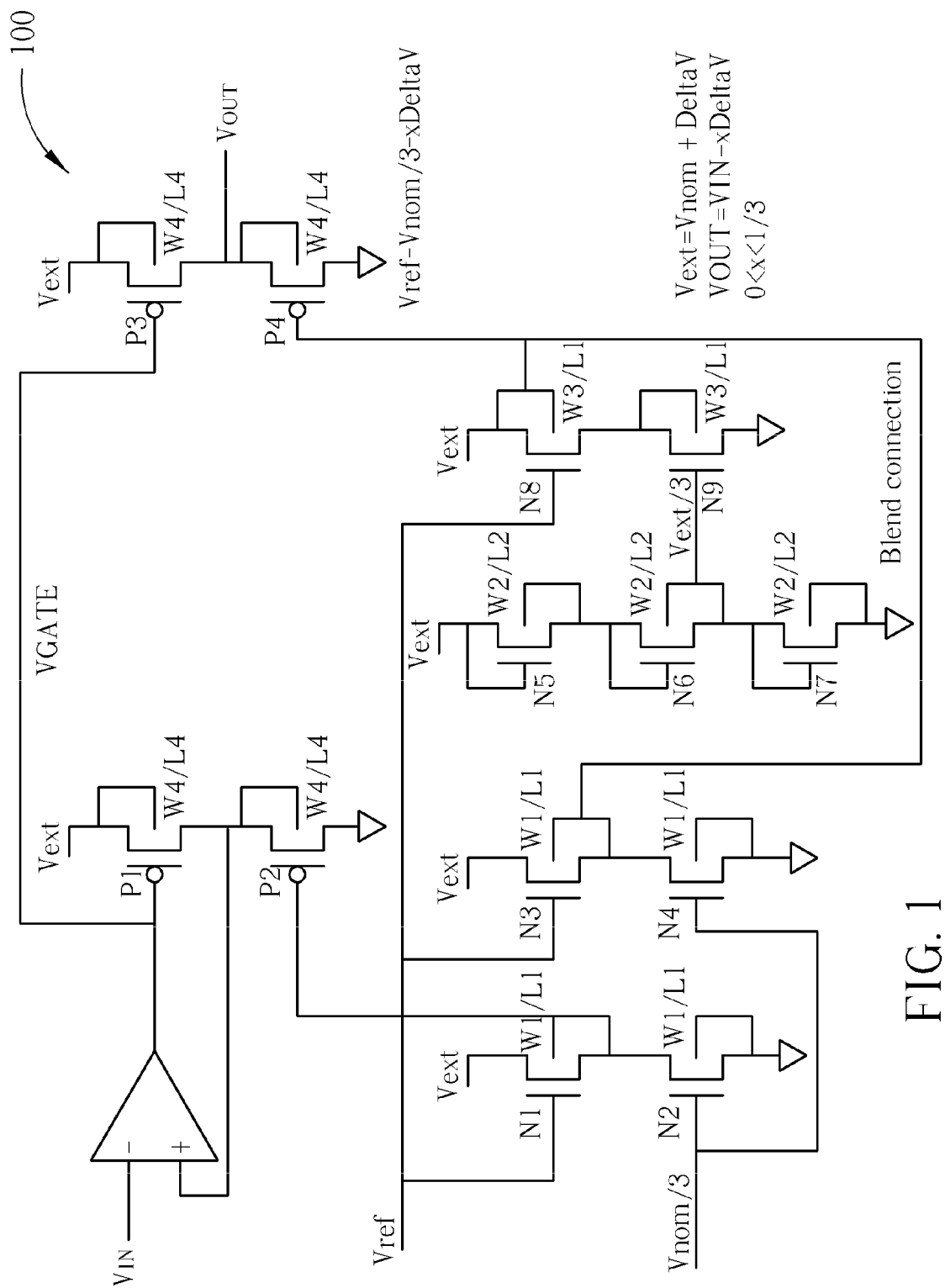
FIG. 1 is a diagram of a compensation circuit according to an exemplary embodiment of the present invention.

A compensation circuit of the present invention has an input bias voltage that is utilized to supply a bias voltage to the pre-drivers. The utilization of the bias voltage means that a current through the pre-drivers will be constant with process and temperature. If, however, there is a change in the external supply then the output will be compensated accordingly. In other words, the output of the compensation circuit is equal to the input of the compensation circuit when the external supply is constant. Please refer to FIG. 1 for a detailed illustration of this operation. FIG. 1 is a diagram of the compensation circuit 100 according to an exemplary embodiment of the present invention.

Devices N1 and N2 are supplied with voltages $V_{ref}$ and $V_{nom/3}$ so that the output of the devices=$V_{ref}-V_{nom/3}$. The output of devices N3 and N4 is similarly $V_{ref}-V_{nom/3}$. Devices N5, N6 and N7 are designed to all have the same gate to source voltage (VGS) so the total output is $V_{ext/3}$. $V_{ext/3}$ is equivalent to $V_{nom/3}+\Delta V/3$. The output of devices N8 and N9 is $V_{ref}-V_{ext/3}$. As $V_{ext/3}$ is equivalent to $V_{nom/3}+\Delta V/3$, the output of devices N8 and N9 can be represented as $V_{ref}-(V_{nom/3}+\Delta V/3)$. There is a blend connection between the outputs of devices N3 and N4 and devices N8 and N9. This blend connection makes the total output=$V_{ref}-V_{nom/3}-\chi\Delta V$. The output of devices N1 and N2 ($V_{ref}-V_{nom/3}$) is input to the device P2. P1 receives the input voltage VIN. The output of devices P1 and P2 is the same level as Vin by the operational amplifier. VOUT is therefore (VIN$-V_{ref}+V_{nom/3}$)$-$($V_{ref}-V_{nom/3}-\chi\Delta V$). This can be rewritten as:

$$\text{VOUT}=\text{VIN}-\chi\Delta V \qquad (1)$$

The gain of devices N3,N4, N8 and N9 can be controlled to give a value of $\chi$ between 0 and ⅓. As can be seen from equation (1), when there is no change in supply voltage (i.e. $\Delta V=0$), the input voltage will equal the output voltage. When the supply voltage changes, the output voltage will be compensated accordingly. If the input voltage is a bias voltage which has temperature and process compensation, the output voltage will have temperature, process, and external supply compensation.

Figure 2:
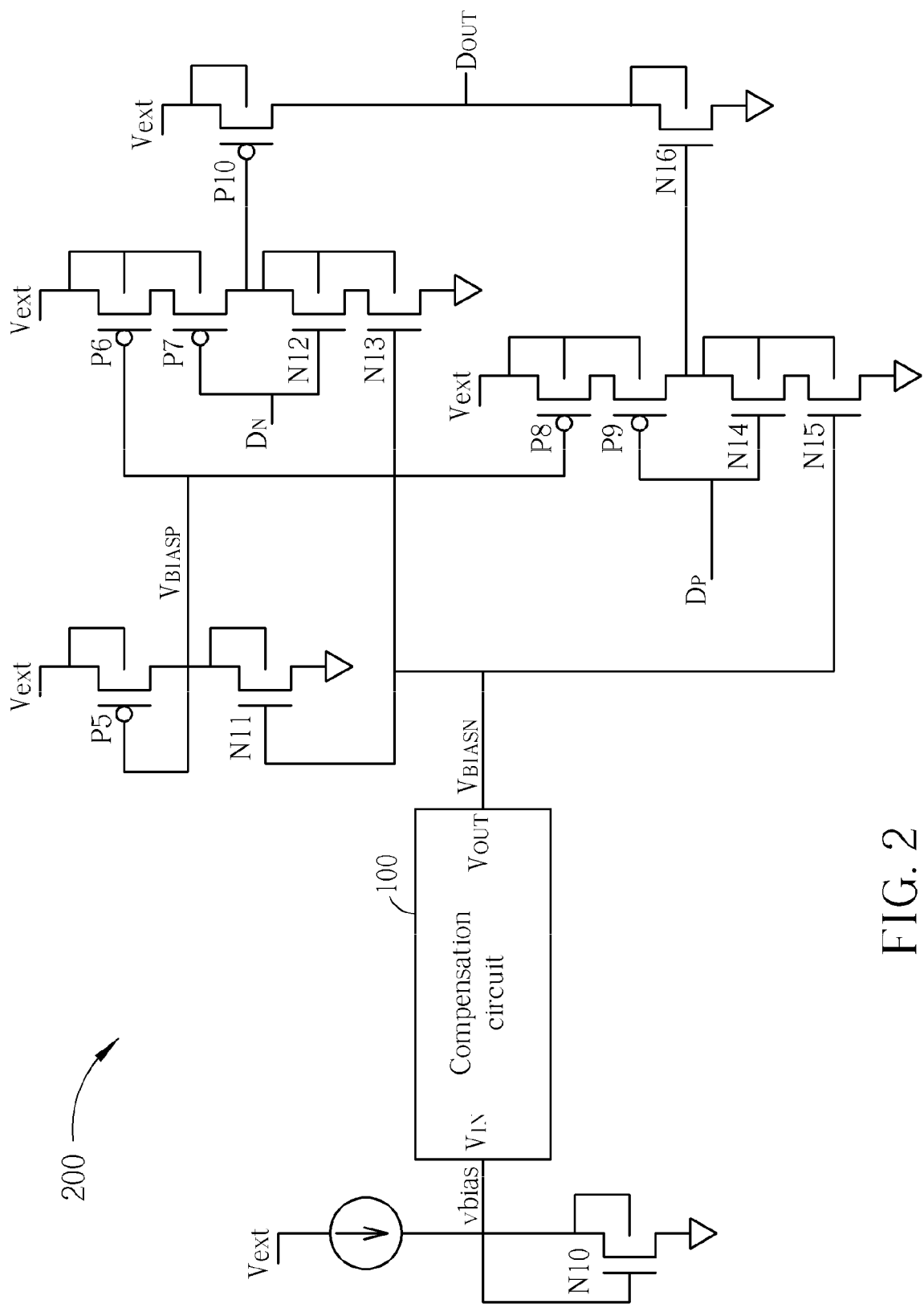
FIG. 2 is a diagram of the compensation circuit shown in FIG. 1 being utilized in an integrated circuit.

Please refer to FIG. 2. FIG. 2 is a diagram of the compensation circuit 100 being implemented in an integrated circuit 200. As can be seen from the diagram, the bias voltage provided as VIN is generated according to an external supply $V_{ext}$. The same external supply is input to the pre-driver and final driver stages. Therefore, when this external supply changes, there will be some corresponding effect on the pre- and final driver stages. The compensation circuit 100 output voltage V is utilized to generate a bias voltage which is input to the n-channel of the pre-driver stage (N14, N15). This bias voltage compensates for the effects of the external supply voltage variation. The n-channel voltage is also mirrored through a current mirror (P5, N11) to generate a bias voltage that is input to the p-channel of the pre-driver stage (P6, P8). The p-channel is similarly compensated by the bias voltage.

The use of the current mirror means that a same constant current is controlled through both the p-channel and the n-channel of the pre-drivers. This not only reduces the amount of circuitry required for compensating the supply voltage of the pre-drivers, but also ensures that variations in supply voltage are compensated to the same degree in both channels. The use of the bias voltage as the input to the compensation circuit minimizes variations in process and temperature, so that the compensation circuit only needs to actively compensate for supply voltage variations.

Those skilled in the art will readily observe that numerous modifications and alterations of the device and method may be made while retaining the teachings of the invention.

What is claimed is:

1. A compensation circuit, for compensating an external supply voltage, the compensation circuit comprising:
    an operational amplifier, having a bias voltage as a first input of the operational amplifier, and a second input;
    a first PMOS pair, coupled to the output of the operational amplifier and the external supply voltage, where the output of the first PMOS pair is the second input of the operational amplifier;
    a second PMOS pair, coupled to the output of the operational amplifier and the external supply voltage, where the output of the second PMOS pair is an output voltage of the compensation circuit, and is equal to the input voltage $-\chi\Delta V$;
    a first NMOS circuit, coupled to the first and second PMOS pair by means of a blend connection, and coupled to the external supply voltage, a reference voltage, and a nominal voltage, for providing an output voltage equal to the reference voltage—the nominal voltage/3 $-\chi\Delta V$; and
    a second NMOS circuit, coupled to the first NMOS circuit and the external supply voltage, for providing an output voltage equal to the external supply voltage/3.

2. The compensation circuit of claim 1, wherein the first NMOS circuit comprises:
    a first NMOS pair, a second NMOS pair, and a third NMOS pair, the output of the first NMOS pair is coupled to the first PMOS pair, and the outputs of the second NMOS pair and the third NMOS pair are coupled to the second PMOS pair by means of the blend connection;
    and the second NMOS circuit comprises:
    a first NMOS;
    a second NMOS; and
    a third NMOS;
    wherein a VGS of the first NMOS, the second NMOS and the third NMOS is the same.

3. The compensation circuit of claim 2, wherein a gain of the first NMOS pair and the third NMOS pair is controlled so that $\chi$ is a number between 0 and ⅓.

4. The compensation circuit of claim 1, being implemented in an integrated circuit comprising at least a pre-driver, for providing the output voltage to the pre-driver that is compensated for with supply voltage variations.

5. An integrated circuit, comprising:
    a pre-driver stage, coupled to an external supply voltage, for controlling final driver stage voltage;
    a final driver stage, coupled to the pre-driver stage and the external supply voltage, for providing an output voltage;
    a compensation circuit, coupled to the pre-driver stage, for providing a first bias voltage to the pre-driver stage that compensates for variation in the external supply voltage, to control current through the pre-driver stage, comprising:
        an operational amplifier, having a second bias voltage as a first input of the operational amplifier, and a second input;
        a first PMOS pair, coupled to the output of the operational amplifier and the external supply voltage, where the output of the first PMOS pair is the second input of the operational amplifier;
        a second PMOS pair, coupled to the output of the operational amplifier and the external supply voltage, where the output of the second PMOS pair is an output voltage of the compensation circuit, and is equal to the input voltage $-\chi\Delta V$;
        a first NMOS circuit, coupled to the first and second PMOS pair by means of a blend connection, and coupled to the external supply voltage, a reference voltage, and a nominal voltage, for providing an output voltage equal to the reference voltage–the nominal voltage/3 $-\chi\Delta V$; and
        a second NMOS circuit, coupled to the first NMOS circuit and the external supply voltage, for providing an output voltage equal to the external supply voltage/3, which is output to the pre-driver stage as the first bias voltage; and
    a bias circuit, coupled to the external supply voltage and the compensation circuit, for providing the second bias voltage to the compensation circuit.

6. The integrated circuit of claim 5, wherein the pre-driver stage comprises an n-channel and a p-channel, the first bias voltage output by the compensation circuit is input to the n-channel of the pre-driver stage, and the integrated circuit further comprises:
    a current mirror, comprising an NMOS PMOS pair, coupled to the first bias voltage output by the compensation circuit, and the p-channel of the pre-driver stage, for mirroring the bias current through the p-channel stage to control current through the p-channel stage.

7. The compensation circuit of claim 5, wherein the first NMOS circuit comprises:
    a first NMOS pair, a second NMOS pair, and a third NMOS pair, the output of the first NMOS pair is coupled to the first PMOS pair, and the outputs of the second NMOS pair and the third NMOS pair are coupled to the second PMOS pair by means of the blend connection;
    and the second NMOS circuit comprises:
    a first NMOS;
    a second NMOS; and
    a third NMOS;
    wherein a VGS of the first NMOS, the second NMOS and the third NMOS is the same.

8. The compensation circuit of claim 7, wherein a gain of the first NMOS pair and the third NMOS pair is controlled so that $\chi$ is a number between 0 and ⅓.

* * * * *